United States Patent [19]

Wurzburg

[11] 4,405,899

[45] Sep. 20, 1983

[54] HIGH PASS FILTER AND METHOD OF MAKING SAME

[75] Inventor: Henry Wurzburg, Tempe, Ariz.

[73] Assignee: Motorola, Inc., Schaumburg, Ill.

[21] Appl. No.: 16,695

[22] Filed: Mar. 1, 1979

[51] Int. Cl.³ .............................................. H03F 1/34
[52] U.S. Cl. ..................................... 330/107; 330/109
[58] Field of Search ................. 330/51, 107, 109, 294; 333/173

[56] References Cited

U.S. PATENT DOCUMENTS 4,210,872  7/1980  Gregorian ............................... 330/9.

OTHER PUBLICATIONS

Jacobs, "Practical Design Considerations for MOS Switched Capacitor Ladder Filters," Electronics Research Laboratory, Un. of California, Berkeley, Nov. 11, 1977, p. 84–89.
Caves et al., "Sampled Analog Filtering Using Switched Capacitors as Resistor Equivalents,"*IEEE Journal of Solid-State Circuits* vol. SC-12, No. 6, Dec. 1977 pp. 592–599.
Gregorian, R., et al., "CMOS Switched-Capacitor Filter for a Two-Chip PCM Voice Coder," *IEEE Int.* Solid State Circuits Conference, Digest of Technical Papers, vol. XXII, 1979-02, Feb. 1979, pp. 28; 273–274.
Hosticka et al., "MOS Sampled Data Recursive Filters Using Switched Capacitor Integrators," *IEEE Journal of Solid-State Circuits* vol. SC-12, No. 6, Dec. 1977, pp. 600–608.

*Primary Examiner*—James B. Mullins
*Attorney, Agent, or Firm*—Anthony J. Sarli, Jr.; Joseph E. Barbee; Robert L. King

[57] ABSTRACT

There is provided a high pass switched capacitor filter having low bandpass ripple. The present filter does not have peaking near its center frequency when sampled at switching frequencies used in communication systems. The high pass filter has three switched capacitor integrators providing a 3-pole Chebyshev high pass switched capacitor filter. A fourth switched capacitor integrator is used to provide an output for the filter. A method of implementing the high pass filter from a set of parameter requirements is also provided. The capacitors used in this filter are ratios of each other and the filter readily lends itself to being implemented as a monolithic integrated circuit, particularly as a CMOS circuit.

12 Claims, 3 Drawing Figures

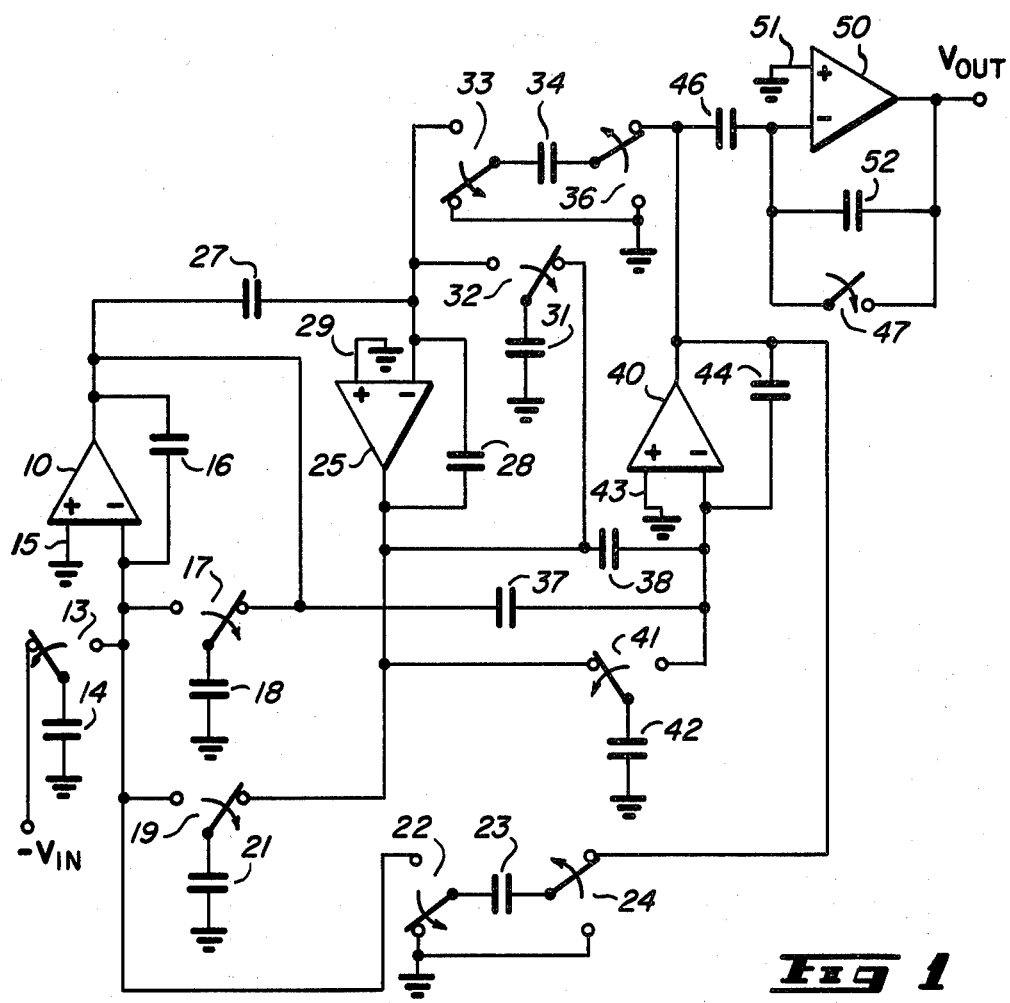
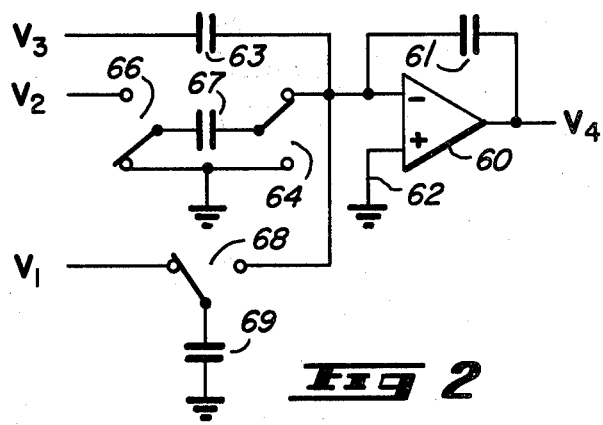
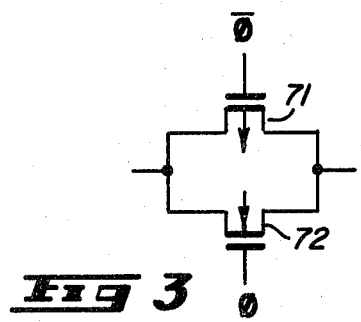

HIGH PASS FILTER AND METHOD OF MAKING SAME

This invention relates, in general, to switched capacitor filters, and more particularly, to high pass switched capacitor filters and method for making same.

Accurate high-order filters are commonly used in various types of electronic systems especially voice-band systems such as telecommunication. Monolithic integrated circuit implementation of these low frequency filters requires the realization of long time constants in small silicon areas, and the realization of transfer functions that are insensitive to parameter variations. It is also desirable to obtain very precise responses without having external trimming components. Conventional active filters implemented with thin-film or hybrid technology do not meet these requirements, and therefore are not suitable for many applications. A recent bipolar/JFET monolithic implementation helped realize these objectives. However, a drawback with this approach is that relatively large chip areas for low frequency applications are required, and the bipolar process is not directly compatible with dense digital logic which is needed for many LSI system applications.

As early as the 1960's, filtering by using switches and capacitors was investigated thoroughly. However, at that time, a suitable integrated circuit technology did not exist which could efficiently realize these filters. More recently, active ladder analog sampled-data recursive filters have been used to implement high-order filters with transfer functions that have very low sensitivity to component variations as compared to cascaded embodiments. When implemented in standard MOS technology these filters achieved a very precise response with wide dynamic range while requiring small chip area, low power dissipation, and relatively low performance operational amplifiers. The low sensitivity of these ladder filters is, to a first order, independent of the sampling frequency. Thus, the anti-aliasing prefilter requirements are greatly reduced when compared to CTD and direct form approaches, by operating the filters at clock frequencies which are many times greater than the pass band frequency. A technique for deriving these active ladder analog sampled-data recursive filters is described in an article entitled "MOS Switched Capacitor Ladder Filters" by D. J. Allstot, R. W. Brodersen, and P. R. Gray, dated Apr. 21, 1978, published by the College of Engineering, University of California, Berkeley, which article is hereby incorporated herein by reference.

Others have postulated a high pass switched capacitor filter using the techniques such as set out in the University of California publication. The technique followed in deriving this filter was to draw the LC prototype signal flow graph, and then replace the integrators with switched capacitors. This filter appears to work, however, it suffers from one major fault. The frequency response of this filter will peak close to the sampling frequency. This peaking effect may not bother a low pass filter sampled at a very high frequency, however, it is not acceptable in a high pass filter used in a PCM codec system. A requirement for the codec system is that the signals must be band limited to half the sampling frequency.

Accordingly, it is an object of the present invention to provide an improved high pass switched capacitor filter having low passband ripple.

Another object of the present invention is to provide a CMOS high pass switched capacitor filter having low passband ripple suitable for use in a PCM voice band system.

Yet another object of the present invention is to provide a high pass switched capacitor filter having switched capacitor integrators which are implemented from terms within a bilinear Z transform difference equation.

A further object of the present invention is to provide a new and improved method for making a switched capacitor filter having low passband ripple.

And yet a further object of the present invention is to provide a method for making a high pass switched capacitor filter containing switched capacitor integrators implemented from terms of a bilinear Z transform difference equation.

SUMMARY OF THE INVENTION

In carrying out the above and other objects of the invention, there is provided a switched capacitor filter having low bandpass ripple. A switched capacitor filter is illustrated by a 3-pole Chebyshev high pass switched capacitor filter having switched capacitor integrators which are derived from bilinear Z transform difference equations.

In a preferred embodiment the present invention is implemented as a monolithic CMOS circuit.

Also provided is a method of making a switched capacitor filter having switched capacitor integrators. First the frequency requirements of the filter are prewarped frequency-wise so that during following transformations the derived filter will still meet the required frequency specification. A passive prototype filter is selected using the prewarped frequencies. As an example, the selective passive prototype filter will contain passive LCR components. The state equations for the passive prototype filter are then derived in Laplace transform or s-plane. The s-plane state equations are then changed to bilinear Z transform state equations. In a preferred embodiment the state equations are obtained as difference equations. The difference equations are then implemented using switched capacitor integrators.

The subject matter which is regarded as the invention as set forth in the appended claims. The invention itself, however, together with further objects and advantages thereof, may be better understood by referring to the following detailed description taken in conjunction with the accompanying drawings.

BRIEF DESCRIPTION OF THE DRAWINGS

FIG. 1 illustrates diagramatically a 3-pole Chebyshev switched capacitor filter;

FIG. 2 illustrates a switched capacitor integrator useful as a portion of the circuit of FIG. 2; and FIG. 3 illustrates a CMOS transmission gate useful as a switching device in FIGS. 1 and 2.

DETAILED DESCRIPTION OF THE DRAWINGS

RC differential integrators useful as audio and other low frequency filters generally have long time constants. If the time constants were realized monolithically, large amounts of silicon chip area would be required. Another disadvantage of the RC differential integrator is that in order to insure reproducibility the absolute values of both the resistors and capacitors must be tightly controlled. This is extremely difficult for typical temperature and processing variations. However, these problems are overcome by using the filter illustrated in FIG. 1, when the ratio of the sampling frequency to the filter break frequency is large. The filter illustrated in FIG. 1 is a 3-pole Chebyshev switched capacitor filter which readily lends itself to being implemented as a monolithic integrated circuit. One of the advantages of switched capacitor filters is that the capacitors can be expressed as ratios of each other as opposed to each having a discrete value.

An input signal $V_{IN}$ is coupled to switch 13. Switch 13 serves to couple the input signal to capacitor 14 and then to couple capacitor 14 to the inverting input of amplifier 10. Capacitor 14 is coupled between switch 13 and a reference potential illustrated as circuit ground. The non-inverting input 15 of amplifier 10 is also coupled to ground. A feedback capacitor 16 is coupled between the output of amplifier 10 and its inverting input. The output of amplifier 10 is also coupled to switch 17. Capacitor 18 is coupled between switch 17 and circuit ground. Switch 17 serves to switch capacitor 18 from the output of amplifier 10 to the inverting input of amplifier 10. The output of amplifier 10 is also coupled by capacitor 27 to an inverting input of another operational amplifier 25. The non-inverting input 29 of amplifier 25 is coupled to ground. A feedback capacitor 28 is coupled between the output of amplifier 25 and its inverting input. Capacitor 31 is coupled between switch 32 and ground. Switch 32 serves to couple the output of amplifier 25 to capacitor 31 and then to couple capacitor 31 to the inverting input of amplifier 25. Capacitor 21 is coupled between switch 19 and circuit ground. Switch 19 serves to couple capacitor 21 from the output of amplifier 25 to the input of amplifier 10. The output of amplifier 25 is directly coupled by capacitor 38 to an inverting input of a third operational amplifier 40.

Capacitor 42 is coupled between ground and switch 41. Switch 41 serves to couple capacitor 42 from the output of amplifier 25 to the inverting input of amplifier 40. The non-inverting input 43 of amplifier 40 is coupled to ground. A feedback capacitor 44 is coupled between the output of amplifier 40 and the inverting input of amplifier 40. Capacitor 23 is coupled between switches 22 and 24. Switch 24 serves to couple the output of amplifier 40 to one end of capacitor 23 and then to switch the one end of capacitor 23 to ground. Switch 22 serves to switch the other end of capacitor 23 to ground and then to the inverting input of amplifier 10. Capacitor 34 is coupled between switches 33 and 36. Switch 36 serves to couple the output of amplifier 40 to one end of capacitor 34 and then to switch the one end of capacitor 34 to ground. Switch 33 serves to switch one end of capacitor 34 to ground and then to the inverting input of amplifier 25. Amplifiers 10, 25, and 40 along with their associated capacitors and switches represent three poles of the switched capacitor filter.

An output switched capacitor integrator having an operational amplifier 50 provides output $V_O$. A feedback capacitor 52 is coupled from the output of amplifier 50 to the inverting input of amplifier 50. Capacitor 46 couples the output of amplifier 40 to the inverting input of amplifier 50. The non-inverting input 51 of amplifier 50 is coupled to ground. Switch 47 is coupled between the inverting input and the output of amplifier 50. Switch 47 resets the output of amplifier 50. The switched capacitor integrator having an amplifier 50 implements a difference equation which combines terms of three other state variables to produce the output $V_O$. The three other state variables are implemented by the other switched capacitor integrators having amplifiers 10, 25, and 40.

The switches of FIG. 1 are electronically implemented and are switched at the sampling frequency of the filter. The switched capacitors are used to simulate resistors. In the preferred embodiment, the filter of FIG. 1 is implemented as a CMOS structure. Although the filter could be implemented by other than CMOS devices, CMOS devices are preferred because the entire circuit can be implemented on a relatively small area of silicon; and CMOS circuits have low power dissipation. The amplifiers of FIG. 1 can be standard differential or operational amplifiers as is becoming well known in the art of switched capacitor filters. The amplifiers are generally, relative low performance operational amplifiers. At first the filter illustrated in FIG. 1 may appear to be a switched capacitor filter implemented in the ordinary manner. However, upon closer inspection it becomes clear the interconnection and interaction of the individual switched capacitor integrators is different than those heretofore known.

The capacitors of FIG. 1 can be expressed as ratios of each other thereby simplifying a monolithic integrated circuit implementation of the filter. By way of example only, the capacitors can have the following ratios to provide a high pass filter for sixty Hertz rejection in PCM voice channels with a passband of 300 to 4 KHz, passband ripple of 0.02 dB peak-to-peak; 60 Hz rejection greater than fifteen dB, 180 Hz rejection less than 1.5 dB, and a switching rate of 8 KHz:

| Capacitor | Ratio |
| --- | --- |
| 14 | 1 |
| 16 | 30.822452 |
| 18 | 2 |
| 21 | 2.065893 |
| 23 | 0.96702595 |
| 27 | 15.66957 |
| 28 | 11.28096 |
| 31 | 2.1363366 |
| 34 | 1 |
| 37 | 14.66957 |
| 38 | 1 |
| 42 | 2 |
| 44 | 7.334785 |
| 46 | 15.172 |
| 52 | 1 |

In selecting the capacitor ratios, preferably, the switched capacitors are as near unity as possible and then the non-switched capacitors will tend to be large.

Reference to FIG. 2 may provide a better understanding of the implementation of the filter of FIG. 1. FIG. 2 shows a switched capacitor integrator having three input voltages, $V_1$, $V_2$, $V_3$, an output voltage $V_4$, and a reference potential illustrated as ground. Operational amplifier 60 has an inverting and an non-inverting input. Non-inverting input 62 is coupled to ground. A feedback capacitor 61 is coupled between the inverting input and the output of amplifier 60. The output of amplifier 60 provides voltage $V_4$. Voltage $V_3$ is coupled to the inverting input of amplifier 50 by capacitor 63. Voltage $V_2$ is controllably coupled to one end of capacitor 67 by switch 66. Switch 66 can controllably switch the one end of capacitor 67 to input $V_2$ or to ground.

The other end of capacitor 67 is controllably switched by switch 64 to ground or to the inverting input of amplifier 60. Capacitor 69 is coupled from ground to switch 68. Switch 68 can controllably switch one end of capacitor 69 from voltage $V_1$ to the inverting input of amplifier 60.

The circuit of FIG. 2 is implemented from a difference equation which has been converted to a bilinear Z transform equation. The difference equation is as follows:

$$\Delta V_4 = V_4[(k+1)T] - V_4(kT) = -\alpha V_1(kT) + \beta V_2(kT) - \gamma[V_3[(k+1)T] - V_3(kT)].$$

This equation can be expressed in the z-plane as follows:

$$(z-1)V_4 = -\alpha V_1 + \beta V_2 - \gamma(z-1)V_3$$

where $V_1$, $V_2$, $V_3$, $V_4$ are the input and output voltages for the switched capacitor integrator illustrated in FIG. 2. T is the sampling period and k is an integer. $\alpha$ is equal to the ratio of the capacitance of capacitor 69 divided by the capacitance of capacitor 61. $\beta$ is equal to the ratio of the capacitance of capacitor 67 divided by the capacitance of capacitor of 61. $\gamma$ is equal to the ratio of the capacitance of capacitor 63 divided by the capacitance of capacitor 61.

The above equations along with FIG. 2 illustrate a switched capacitor integrator which is implemented from a difference equation, and in the present case, preferably from equations in the z-plane derived by bilinear transform. The method for arriving at the z-plane equations can be achieved by those skilled in the art once the procedure to be followed is learned. As is well known, in order to design a filter the bandpass ripple, passband frequency, stop band frequency, and stop band rejection must be known. The passband ripple frequency and stop band frequencies are prewarped to compensate for a frequency warping effect which takes place during a later transformation which is made. The warped frequency, $\omega$, can be obtained (in radians) by multiplying two times the arc tangent of the specified frequency, $\Omega$, (in radians) times T the period of the sampling frequency divided by two which can be written in the following manner:

$$\omega \text{ (new freq.)} = 2 \text{ arc tan } \frac{\Omega T}{2}$$

Once the prewarped frequencies are known, reference can be made to a standard filter table so that a passive type filter can be derived. As an example, the passive filter equivalent of the filter of FIG. 1 would be a 3-pole Chebyshev high pass prototype doubly terminated ladder filter. State equations for the passive type filter are then reduced to their lowest terms. Through Laplace transformation these equations are then converted to the s-plane. The s-plane equations are then transformed to the z-plane by bilinear Z transform. This transformation is done by the well known technique of changing each s to two times $z-1$ over $z+1$. What the transformation does is it converts the s-plane poles and zeros into an appropriate z-plane pole zero pattern that yields the same frequency magnitude response as the s-plane filter does. A frequency warping effect occurs in the conformal warping from the s-plane to the z-plane. In other words, the magnitudes would be the same for the frequency response but the frequency is gradually compressed. It is a non-linear compression or arc tangent compression. However, prewarping these frequencies prior to deriving the passive type filter compensates for the conformal transformation warping that occurs. Once the bilinear z transform is performed then the equations are preferably placed in difference equation format. These difference equations can then be implemented as a switched capacitor filter by using switched capacitor integrators as has been shown hereinbefore.

FIG. 3 illustrates the preferred CMOS implementation of the switches shown in FIGS. 1 and 2. Transistor 71 is a P-channel transistor in parallel with an N-channel transistor 72. The gate of transistor 72 is shown as being enabled by timing signal $\phi$ while the gate of transistor 71 is shown enabled by a timing signal $\overline{\phi}$. $\phi$ and $\overline{\phi}$ are complements of each other. The transmission gate of FIG. 3 could be a direct replacement for switch 47 in FIG. 1. Switch 13 can be two of the transmission gates in series with capacitor 14 connected to the common line between the two transmission gates. Of course, to implement switch 13, the P-channel transistor of the second transmission gate would be enabled by $\phi$ and the N-channel transistor of the second transmission gate would be enabled by $\overline{\phi}$.

By now it should be appreciated that there has been provided a new and improved filter along with a method for implementing such a filter. The filter of the present invention does not suffer from the peaking problem associated with filters implemented by the prior art technique of deriving the flow graph of a passive filter, and then replacing integrator blocks with switched capacitor integrators. The prior art approach of implementing switched capacitor filters can be described as modeling the passive filter, while the approach of the present invention takes passive filter characteristics and mathematically transforms them into a discrete time plane, the z-plane, and then implements a switched capacitor filter from terms within the mathematical transformation represented by difference equation. This approach eliminates any peaking that may occur near the center of the band pass. The break frequency of the filter should be between 30 and 40 times below the switching frequency. The present filter has particular application to high pass filters.

I claim:

1. A high pass, switched capacitor filter having an input and an output, comprising: a first operational amplifier having a first and a second input and an output, the second input being coupled to a reference terminal; a first capacitor coupled to the reference terminal; a first switch for switching the first capacitor to the filter input and then to the first input of the first amplifier; a second capacitor coupled between the first input and the output of the first amplifier; a third capacitor coupled to the reference terminal; a second switch for switching the third capacitor to the output of the first amplifier or to the first input; a second operational amplifier having a first and a second input and an output, the second input being coupled to the reference terminal; a fourth capacitor coupled between the output of the first amplifier and the first input of the second amplifier; a fifth capacitor coupled between the first input of the second amplifier and the output of the second amplifier; a sixth capacitor coupled to the reference terminal; a third switch for coupling the sixth capacitor to the output of the second amplifier or to the first input of the second amplifier; a seventh capacitor coupled to the reference terminal; a fourth switch for switching the seventh capacitor to the output of the second amplifier or to the first input of the first amplifier; a third operational amplifier having a first and a second input and an output, the second input being coupled to the reference terminal; an eighth capacitor coupled between the output of the second amplifier and the first input of the third amplifier; a ninth capacitor coupled between the output of the first amplifier and the first input of the third amplifier; a tenth capacitor coupled to the reference terminal; a fifth switch for switching the tenth capacitor to the output of the second amplifier or to the first input of the third amplifier; an eleventh capacitor coupled between the output of the third amplifier and the first input of the third amplifier; a twelfth capacitor having a first and a second terminal; a sixth switch for switching the first terminal of the twelfth capacitor to the output of the third amplifier or to the reference terminal; a seventh switch for switching the second terminal of the twelfth capacitor to the first input of the first amplifier or to the reference terminal; a thirteenth capacitor having a first and a second terminal; an eighth switch for switching the first terminal of the thirteenth capacitor to the output of the third amplifier or to the reference terminal; and a ninth switch for switching the second terminal of the thirteenth capacitor to the reference terminal or to the first input of the second amplifier.

2. The switched capacitor filter of claim 1 further including a fourth operational amplifier having a first input, a second input and an output, the second input being coupled to the reference terminal; a fourteenth capacitor coupled between the first input of the fourth amplifier and the output of the third amplifier; a fifteenth capacitor coupled between the output of the fourth amplifier and the first input of the fourth amplifier; and a tenth switch for resetting the output of the fourth amplifier.

3. The switched capacitor filter of claim 2 wherein all of the switches are electronic switches controllable by an input timing signal.

4. The switched capacitor filter of claim 2 wherein the amplifiers are CMOS amplifiers and all the switches other than the tenth switch are CMOS transmission gates, the tenth switch being a field effect transistor.

5. The switched capacitor filter of claim 1 wherein all the capacitors are ratios of each other.

6. The switched capacitor filter of claim 5 wherein the first, eighth, and thirteenth capacitors are a ratio of one; the third, and tenth capacitors are a ratio of two; the second capacitor has a ratio of substantially 30.8; the fourth capacitor has a ratio of sustantially 15.6; the fifth capacitor has a ratio of sustantially 11.2; the sixth capacitor has a ratio of substantially 2.1; the seventh capacitor has a ratio of substantially 2.06; the ninth capacitor has a ratio of substantially 14.6; the eleventh capacitor has a ratio of substantially 7.3; and the twelfth capacitor has a ratio of substantially 0.9.

7. The switched capacitor filter of claim 2 wherein all the capacitors are ratios of each other.

8. The switched capacitor filter of claim 7 wherein the fourteenth capacitor is a ratio of substantially 15.1, the fifteenth capacitor is a ratio of substantially one.

9. The switched capacitor filter of claim 2 wherein the first input of each of the operational amplifier is an inverting input and the second input of each of the operational amplifiers in a non-inverting input.

10. A method for providing a switched capacitor filter, comprising the steps of:
providing filter equations which define a passive filter design for a prototype filter having frequency characteristics differing from frequency characteristics of said switched capacictor filter by a prewarped amount;
applying a Laplace transform to the filter equations to obtain s-plane state equations;
applying a bilinear Z transform to the s-plane state equations;
expressing the results of the bilinear Z transform to the s-plane state equations in difference equation format; and
implementing the difference equations using switched capacitor integrator structures.

11. A method for making a high pass switched capacitor filter having a predetermined stop band frequency, comprising: prewarping the stop band frequency; selecting a passive filter prototype; obtaining s-plane state equations for the passive filter prototype; converting the s-plane state equations to equations in bilinear Z transform format and otaining difference equations; and implementing the resulting difference equations using switched capacitor integrator structures.

12. A method of providing a switched capacitor filter for a desired passband break frequency and stop band frequency, comprising: prewarping the pass band break frequency and the stop band frequency to obtain prewarped equivalent frequencies; selecting a passive prototype filter having the prewarped frequencies; obtaining state equations for the passive prototype filter in s-plane domain; transforming the s-plane state equations to bilinear Z transform state equations in difference equation form; and implementing the difference equations using switched capacitor integrator structures.

* * * * *